United States Patent [19]
Kim et al.

[11] Patent Number: 6,100,102
[45] Date of Patent: Aug. 8, 2000

[54] METHOD OF IN-LINE MONITORING FOR SHALLOW PIT ON SEMICONDUCTOR SUBSTRATE

[75] Inventors: Yang-hyong Kim; Chun-ha Hwang, both of Seoul; Hyo-cheon Kang; Deok-yong Kim, both of Kyungki-do, all of Rep. of Korea

[73] Assignee: Samsung Electronics Co., Ltd., Suwon, Rep. of Korea

[21] Appl. No.: 09/265,840

[22] Filed: Mar. 10, 1999

[30] Foreign Application Priority Data

May 18, 1998 [KR] Rep. of Korea ............... 98-17992

[51] Int. Cl.⁷ ................... G01R 31/26; H01L 21/66
[52] U.S. Cl. ................... 438/14; 438/16; 438/17
[58] Field of Search ................... 438/14, 16, 17, 438/510

[56] References Cited

U.S. PATENT DOCUMENTS

| | | |
|---|---|---|
| 4,912,052 | 3/1990 | Miyoshi et al. . |
| 5,464,779 | 11/1995 | Fujimaki . |
| 5,807,761 | 9/1998 | Coronel et al. ............ 438/14 |

*Primary Examiner*—Kevin M. Picardat
*Assistant Examiner*—D. Mark Collins
*Attorney, Agent, or Firm*—Jones Volentine, LLP

[57] ABSTRACT

A method of in-line monitoring for shallow pits formed on a semiconductor substrate using an electron beam. The electron beam is scanned across exposed pads on the semiconductor substrate and relative concentrations of secondary electrodes are examined to identify shallow pits.

16 Claims, 6 Drawing Sheets

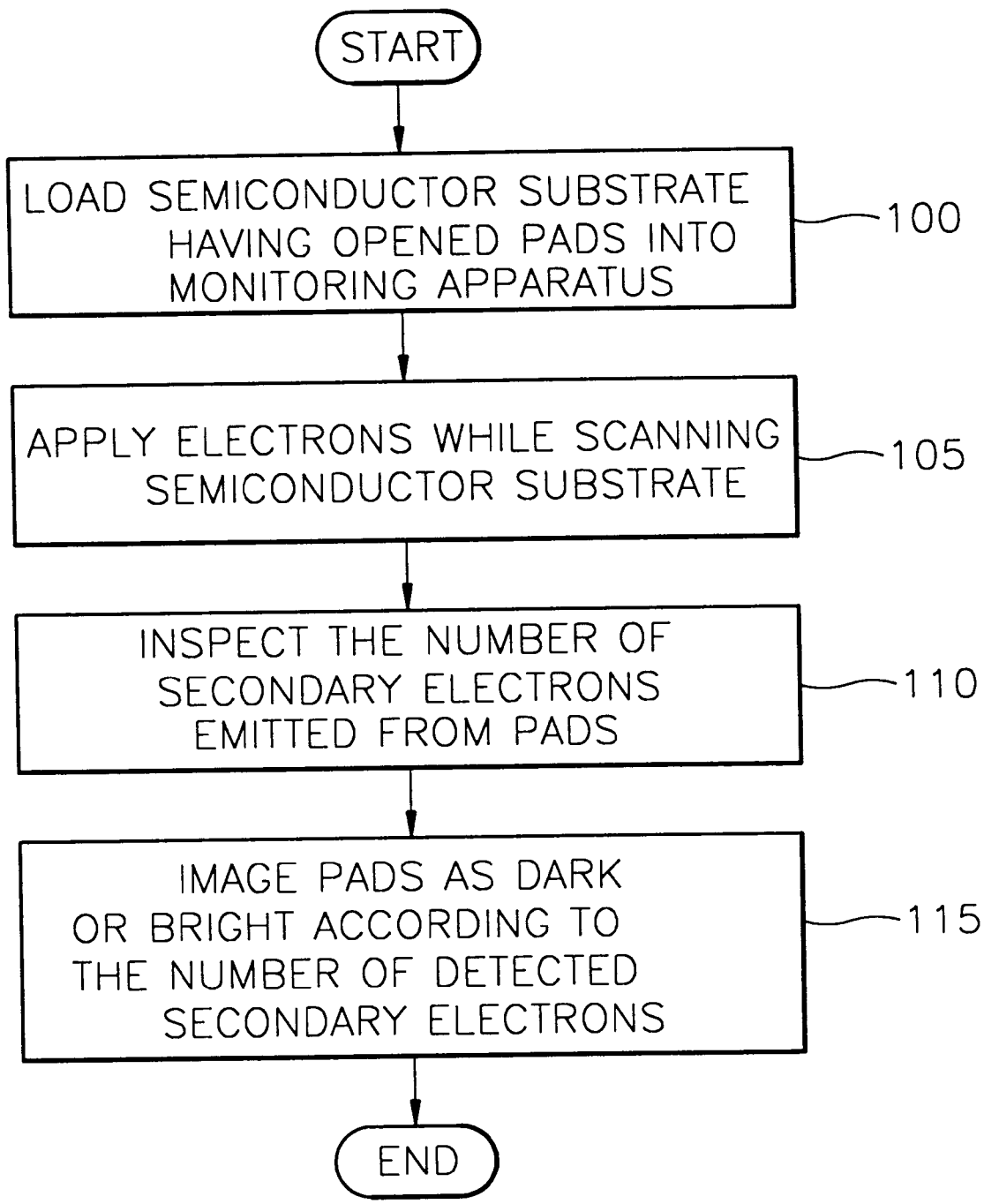

METHOD OF IN-LINE MONITORING FOR SHALLOW PIT ON SEMICONDUCTOR SUBSTRATE

BACKGROUND OF THE INVENTION

The present invention relates to a method of in-line monitoring for a shallow pit. More particularly, the present invention relates to a method of in-line monitoring for a shallow pit on a semiconductor substrate while manufacturing a semiconductor device.

The shallow trench isolation (STI) process is one response to increasing densities in semiconductor devices. However, an impurity or a vacancy formed on the semiconductor substrate during the shallow trench isolation process often becomes a shallow pit. For example, shallow pit formation may occur during subsequent annealing steps. The shallow pit may cause bit failure or refresh failure, thus, reducing the manufacturing yield for the semiconductor device. Once formed, shallow pits cannot be completely removed. Thus, process conditions or process steps likely to form shallow pits must be understood, monitored, and remedied where reasonably possible.

These requirements prove problematic since shallow pits cannot be detected without the aid of an additional chemical process. In other words, since the shallow pit exists on the semiconductor substrate it does not affect the surface morphology of the semiconductor device under manufacture. Accordingly, the generation of shallow pits cannot be automatically monitored by a conventional image measuring apparatus designed to detect surface morphology or pattern distortion. This being the present case, shallow pit monitoring is done by manually scanning the semiconductor substrate using a conventional magnifying apparatus. This conventional process is, however, unacceptable. Shallow pit monitoring by manual means cannot be trusted and reliability cannot be ensured.

The only other conventional remedy determines shallow pit generation through feedback data obtained by testing the completed semiconductor device. This method wastes a great deal of time. Further, it is difficult to correlate the feedback data with the processing conditions or steps causing shallow pit formation.

SUMMARY OF THE INFORMATION

The present invention provides a method for "real-time" or "in-line" monitoring of shallow pit formation in a semiconductor substrate. That is, during the sequence of steps required to manufacture the semiconductor device, the present invention may detect the formation of shallow pits.

In one aspect, the present invention provides a method of in-line monitoring for shallow pits formed in a semiconductor device, comprising the steps of; applying an electron beam to a semiconductor substrate having an exposed pad, and detecting a shallow pit formed on the semiconductor substrate by determining a number of secondary electrons emitted from a surface of the exposed pad during in-line manufacturing of the semiconductor device.

An annealing step may be performed on the semiconductor substrate before application of the electron beam. The exposed pad may be formed over an impurity diffusion region of the semiconductor substrate, for example, a source/drain region, and may be formed from a doped polysilicon layer. The exposed pad may also be formed from a metal layer, in which case the annealing step may be omitted.

In another aspect, the present invention provides a method of in-line monitoring for shallow pits formed in a semiconductor device, comprising the steps of; applying an electron beam to a semiconductor substrate having a plurality of exposed pads to produce secondary electrons accumulating on the plurality of exposed pads, and detecting shallow pits formed on the semiconductor substrate by imaging the plurality of exposed pads, wherein the imaging of the plurality of exposed pads identifies relatively darker ones of the plurality of exposed pads during in-line manufacture of the semiconductor device, and wherein the darker ones of the plurality of exposed pads have relatively fewer secondary electrons accumulated thereon.

In yet another aspect, the present invention provides a method of in-line monitoring for shallow pits, comprising the steps of; loading a semiconductor substrate having a plurality of exposed pads into a shallow pit monitoring apparatus during in-line manufacturing of the semiconductor device, by means of an electron-beam gun associated with the shallow pit monitoring apparatus, applying electrons to the plurality of exposed pads while scanning the loaded semiconductor substrate to produce secondary electrons accumulating on a surface of the plurality of exposed pads, inspecting the semiconductor substrate using the shallow pit monitoring apparatus to detect a relative number of secondary electrons accumulated on the plurality of exposed pads, and comparing the detected relative number of secondary electrons on adjacent ones of the plurality of exposed pads to determine whether shallow pits are present on the semiconductor substrate.

BRIEF DESCRIPTION OF THE DRAWINGS

The present invention with its attendant advantages will be understood by those of ordinary skill in the art upon review of the written description of the preferred embodiment together with the attached drawings in which:

FIG. 3 is a flowchart illustrating an in-line monitoring method of shallow pits according to the present invention;

DESCRIPTION OF THE PREFERRED EMBODIMENT(S)

The present invention now will be described with reference to the accompanying drawings, in which preferred embodiments of the present invention are shown. This invention may, however, be embodied in many different forms and should not be construed as being limited to the embodiments set forth herein. Rather, these embodiments are exemplary and provided to convey the making and using of the present invention to those of ordinary skill in the art.

Figure 1:
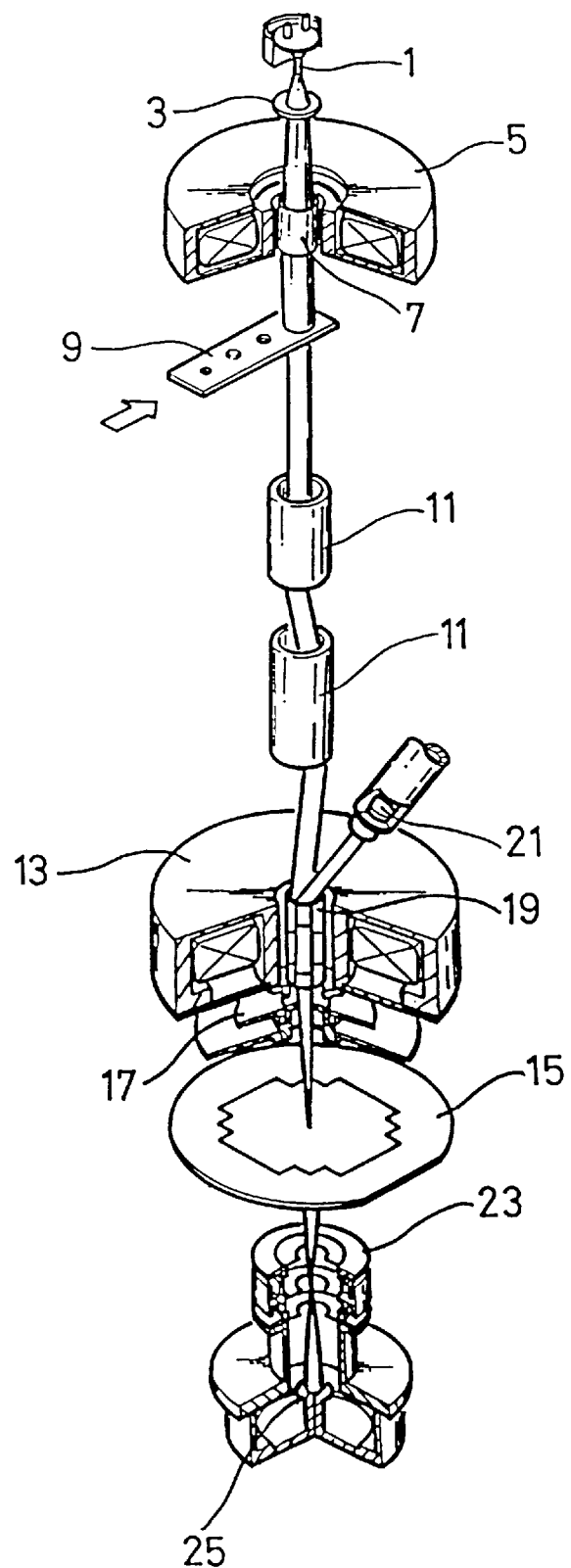
FIG. 1 shows a shallow pit monitoring apparatus used according to the present invention.

In the shallow pit monitoring apparatus according to the present invention, and as shown in FIG. 1, electrons emitted from an electron-beam gun 1 are accelerated before passing through a gun aperture 3. A condenser lens 5 collimates the dispersing electron beam. The collimated electron beam passes through an electrostatic octapole 7 which provides astigmatism correction and alignment, and then through a beam adjustable aperture 9 and an icosapole deflector 11. Having passed through adjustable aperture 9 and the icosapole deflector 11, the electron beam is input to a sample 15 after passing through an object lens 13. The sample 15 can be moved along the X-axis and a Y-axis, although this capability is not shown in the drawing for the sake of clarity.

Secondary electrons emitted from the sample 15 after passing through the object lens 13 are detected by a secondary electron detector 21 through an extraction electrode 17 and a Wien filter 19. A positive voltage, for example 600 V is applied to extraction electrode 17, and a negative voltage, for example −100 V, is applied to sample 15, so that the secondary electrons have kinetic energy of at least 100 electron volts so as to move to the secondary electron detector 21 through the Wien filter 19. The Wien filter 19 is composed of an electrostatic octapole and a 60° magnetic field deflector, so that opposing electric and magnetic deflections cancel for the electron beam by adjusting Wien filter 19.

Figure 2:
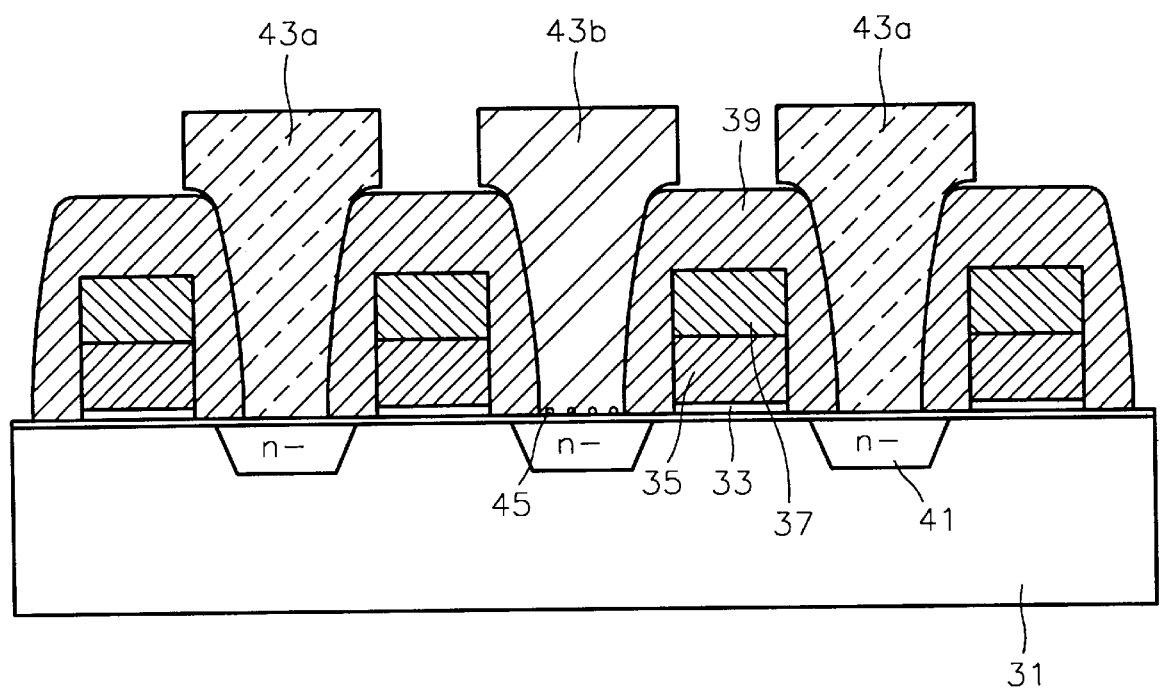
FIG. 2 shows a semiconductor substrate having exposed pads which is used in the shallow pit monitoring method according to the present invention.

As shown in FIG. 2, sample 15 may be a semiconductor substrate 31 having exposed pads 43a and 43b or a mask substrate (not shown). If sample 15 is a mask substrate, which has an electron beam transmission region, electron beam 2 passes through an electrostatic transmission lens 23 and is then input to a transmitted electron detector 25 to be detected.

The central, theoretical principles of shallow pit monitoring using the shallow pit monitoring apparatus according to the present invention will now be described with reference to FIGS. 1 and 2. A semiconductor substrate is assumed as sample 15 for the following description of shallow pits monitoring according to the present invention.

Semiconductor substrate 31 has exposed pads 43a and 43b. In this example, semiconductor substrate 31 is a P-type silicon substrate having a gate oxide layer 33, and gate electrodes 35 and 37 formed of polysilicon and tungsten silicide, respectively, formed thereon. An insulating layer 39 insulates gate electrodes 35 and 37, and pads 43a and 43b are formed between the gate electrodes. N-type impurity diffusion regions, for example, source and drain regions 41, are formed using an impurity of As or P, for examples, as dopants. Pads 43a and 43b are conductive layers formed over the impurity diffusion regions, and may be formed of polysilicon doped with an impurity such as As or P. After forming pads 43a and 43b, semiconductor substrate 31 in which pads 43a and 43b were exposed was annealed at 850° C. for 120 minutes to undo damage corresponding to activation of an impurity in pads 43a and 43b.

Pads 43a and 43b may also be formed from a metal layer, in which case the annealing step may be omitted.

In the shallow pit monitoring apparatus of FIG. 1, in a case lacking shallow pit 45, few of the electrons emitted from electron-beam gun 1 flow to semiconductor substrate 31, so that negative electrons accumulate on the surface of pad 43a. If the negative electrons accumulate on the surface of pad 43a, many of the secondary electrons are emitted from the surface of pad 43a due to the repulsive force caused by negative electrons on the surface of pad 43a while detecting the presence of shallow pits using the monitoring apparatus according to the present invention. Pad 43a from which many electrons are emitted has a brighter or whiter image than that of adjacent pad 43b. If shallow pit 45 is present on semiconductor substrate 31, thereby causing a source leakage, few, if any, electrons will accumulate on the surface of pad 43b. Thus, few secondary electrons will be emitted from the surface of pad 43b, causing a dark or black image to be seen through the monitoring apparatus. Also, if pads 43a and 43b are not exposed, the image of pads 43a and 43b is bright. The apparatus thus allows detection of whether the pads are not exposed, considering the case where shallow pits are present.

The in-line monitoring method for shallow pit detection according to the present invention will now be described with reference to FIGS. 1 through 3. A semiconductor substrate having a plurality of exposed pads, such as that shown in FIG. 2, is positioned, or loaded, as is sample 15 upon the shallow pit monitoring apparatus shown in FIG. 1 (step 100). Semiconductor substrate 31 is obtained in a desired state after a polysilicon layer(s) forming the pads is formed during the manufacture of the semiconductor device. Pads 43a and 43b may be exposed using a chemical mechanical polishing technique, for example.

In this state, electrons from electron-beam gun 1 of the pit monitoring apparatus are applied to pads 43a and 43b while scanning the semiconductor substrate along the X-axis and Y-axis (step 105). In a case where no shallow pits 45 are present, i.e., 43a in FIG. 2, the electrons emitted from electron-beam gun 1 do not flow smoothly to substrate 31, so electrons accumulate on the surface of pad 43a. In contrast, given the source leakage caused by shallow pit 45 on semiconductor substrate 31 in relation to pad 43b, the electrons will flow towards semiconductor substrate 31 through pad 43b and source/drain region 41, rather than accumulating on the surface of pad 43b.

Semiconductor substrate 31 is sequentially inspected by the shallow pit monitoring apparatus to detect the number of secondary electrons emitted from the plurality of pads using the secondary electron detector (step 110). At this time, many secondary electrons are emitted from the surface of pad 43a where many electrons are accumulated due to the repulsive force caused by the negative electrons, but few secondary electrons are emitted from the surface of pad 43b where few if any electrons are accumulated.

The numbers of detected secondary electrons from adjacent pads are compared, and the images of black or white pads are considered to thereby determine whether a shallow pit is generated in the semiconductor substrate (step 115). At this time, pad 43a from which many electrons are emitted has a bright or white image compared to an adjacent pad 43b. Meanwhile, if a leakage source exists due to shallow pit 45 on semiconductor substrate 31, fewer secondary electrons are emitted from the surface of pad 43b, so that the image is dark or black compared to adjacent pad 43a. Thus, in the measured data, the dark pad denotes the presence of a shallow pit and the bright pad denotes the absence of a shallow pit.

Figure 4A:
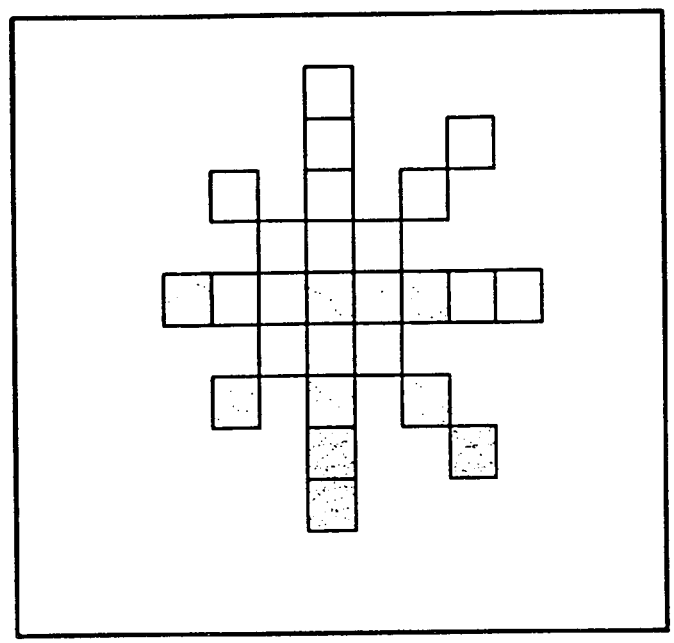
FIGS. 4A through 4D show a semiconductor substrate dark pad map measured by a shallow pit monitoring apparatus according to the present invention.
Figure 4B:
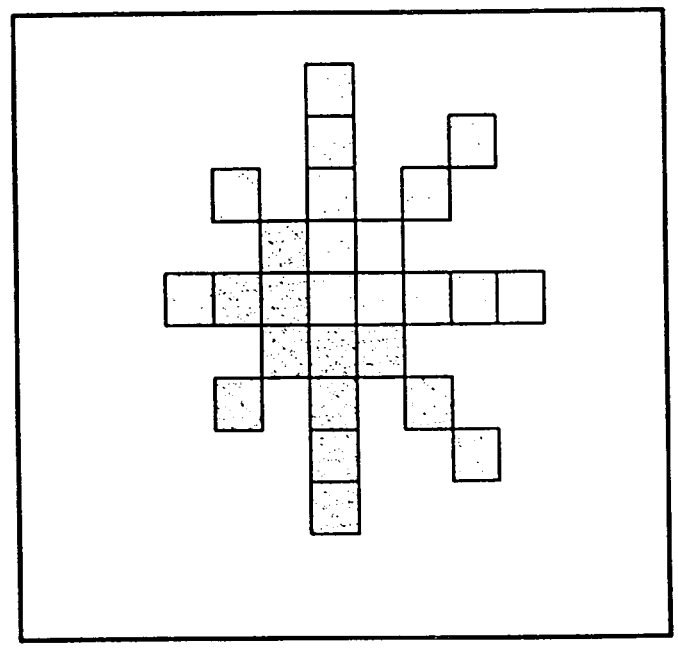
Figure 4C:
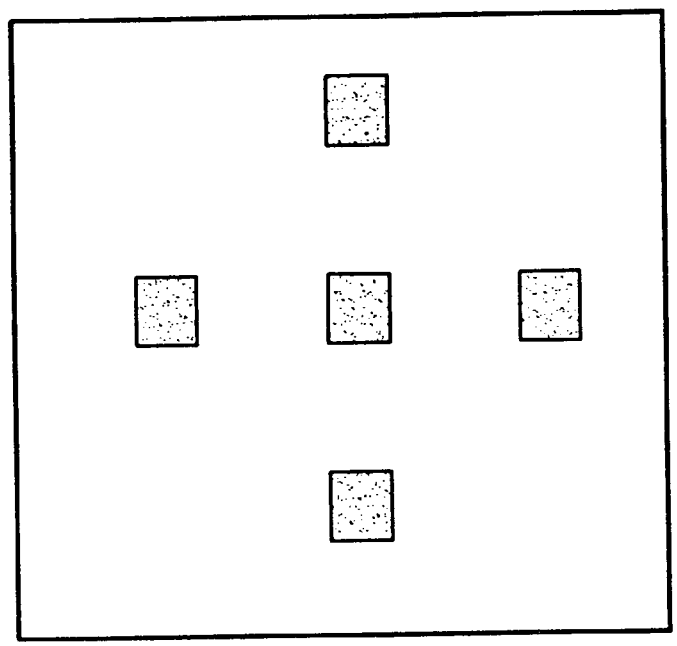
Figure 4D:
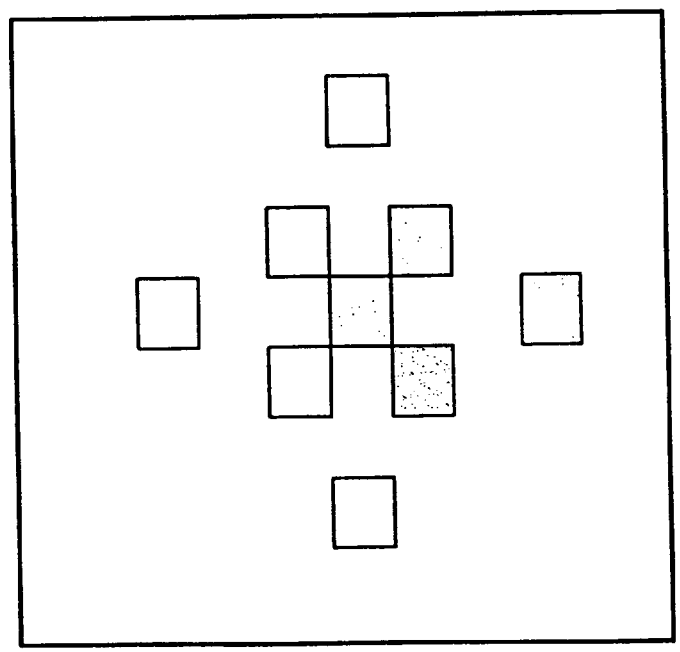

Referring to FIGS. 4A through 4D, a dark pad appears at an edge portion of the semiconductor substrate of FIG. 4A, at the center and edge of the semiconductor substrate of FIG. 4B, over the whole semiconductor substrate of FIG. 4C, and in the center of the semiconductor substrate of FIG. 4D. The portions in which dark pads appear are portions in which shallow pits have formed.

Figure 5:
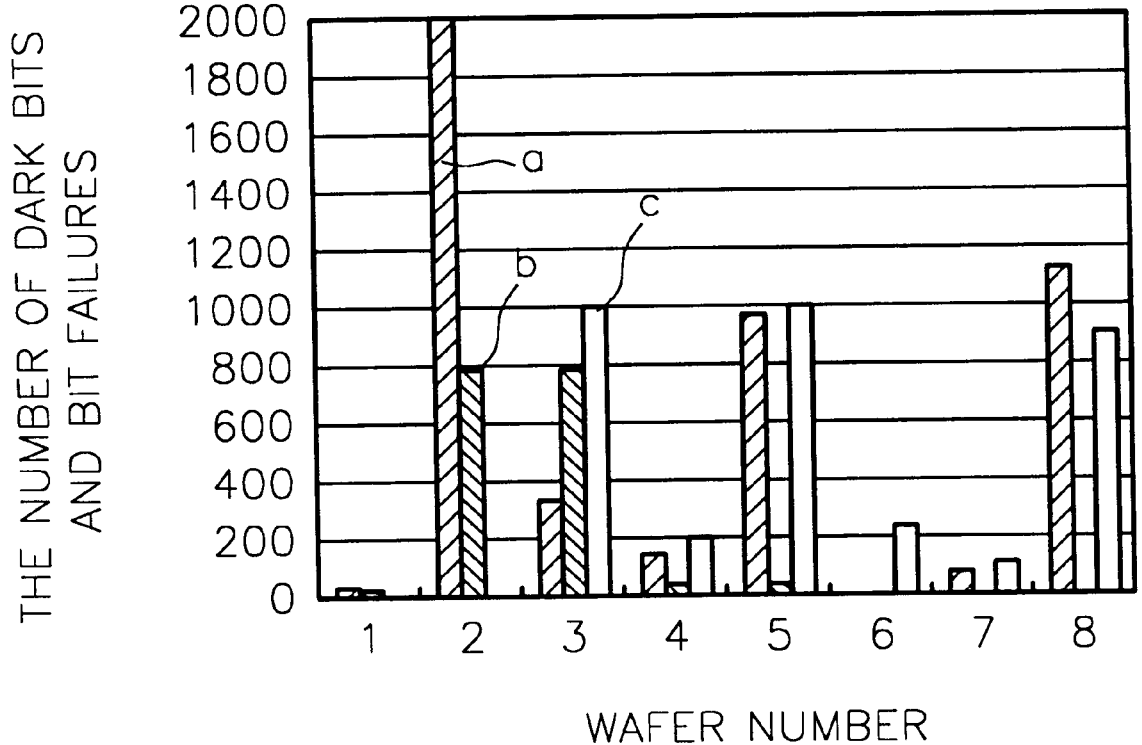
FIG. 5 is a graph illustrating the occurrence of dark pads and bit failures identified when inspected by the shallow pit monitoring apparatus according to the present invention.

Referring to the graph of FIG. 5, the horizontal axis denotes the number of semiconductor substrates (the wafer number) having an exposed pad, and the vertical axis denotes the number of dark pads and the number of bit failures after manufacturing a semiconductor device. In FIG. 5, reference numeral a denotes the number of dark pads, reference numeral b denotes the number of bit failures measured when a voltage is applied at intervals of 12 milliseconds, at room temperature, and reference numeral c denotes the number of bit failures measured when a voltage is applied at intervals of 64 milliseconds at a high temperature. As shown in FIG. 5, as the number of dark pads increases, i.e., as the number of shallow pits increases, the number of bits failures also increases after final manufacture of the semiconductor device.

According to the present invention, a shallow pit monitoring apparatus according to the present invention can monitor shallow pits in-line during the manufacturing of the semiconductor device. The results of this monitoring process obtained by use of the shallow pit monitoring apparatus and method according to the present invention yield reliable test data in real-time. Shallow pit formation can thus be detected before completion of the semiconductor device and yield of the semiconductor device may be improved.

Although the present invention has been described in detail above, various changes, substitutions and alterations thereto will become apparent to those of ordinary skill in the art. All such changes, substitutions and alterations are seen to be within the true spirit and scope of the invention as defined by the appended claims.

What is claimed is:

1. A method of inspecting for the presence of shallow pits during the manufacturing of a semiconductor device, comprising the steps of:

producing a beam of electrons;

directing the electron beam onto an exposed pad formed on a semiconductor substrate, whereby electrons of the beam will leak from the pad if a series of shallow pits are present in a portion of the semiconductor substrate beneath the pad and will accumulate on the pad if the portion of the semiconductor substrate beneath the pad is free of the shallow pits;

detecting for secondary electrons emitted from a surface of the exposed pad during in-line manufacturing of the semiconductor device; and determining whether shallow pits are present beneath the exposed pad based on results of the detection for secondary electrons.

2. A method of inspecting for the presence of shallow pits during the manufacture of a semiconductor device, comprising the steps of:

producing a beam of electrons;

directing the electron beam onto a plurality of exposed pads formed on a semiconductor substrate to produce secondary electrons accumulating on at least those exposed pads located above portions of the semiconductor substrate which are free of shallow pits; and subsequently forming images of the exposed pads, during in-line manufacture of the semiconductor substrate, whose brightness are indicative of the amount of secondary electrons accumulated on the pads, respectively, whereby relatively darker ones of the images are indicative of exposed pads having relatively fewer secondary electrons accumulated thereon thereby in turn indicating the presence of shallow pits.

3. A method of inspecting for the presence of shallow pits during the manufacture of a semiconductor device, comprising the steps of:

loading a semiconductor substrate having a plurality of exposed pads into a shallow pit monitoring apparatus during in-line manufacturing of the semiconductor device;

producing a beam of electrons with the shallow pit monitoring apparatus, and scanning the semiconductor substrate with the electrons to direct the electrons onto the plurality of exposed pads and thereby produce secondary electrons accumulating on a surface of at least those exposed pads located above portions of the semiconductor substrate which are free of shallow pits;

detecting for the presence of secondary electrons accumulated on the respective surfaces of the plurality of exposed pads; and comparing the amount of detected secondary electrons on the respective surfaces of adjacent ones of the plurality of exposed pads to determine whether shallow pits are present on the semiconductor substrate.

4. A sequence in the manufacture of a semiconductor device for determining whether shallow pits are present on a semiconductor substrate before the semiconductor device is completed, comprising the steps of:

forming at least one exposed pad over a semiconductor substrate;

producing a beam of electrons;

directing the electron beam onto the at least one exposed pad during the in-line manufacturing of the semiconductor device, whereby electrons of the beam will accumulate on the pad if the portion of the semiconductor substrate beneath the pad is free of shallow pits;

detecting for secondary electrons emitted from a surface of the exposed pad, during in-line manufacturing of the semiconductor device; and determining whether a shallow pit is present beneath the exposed pad based on the detection for secondary electrons.

5. The sequence in the manufacture of a semiconductor device of claim 4, and further comprising a step of annealing the semiconductor substrate before the electron beam is directed onto the exposed pad.

6. The sequence in the manufacture of a semiconductor device of claim 4, wherein said step of forming the exposed pad comprises forming the pad over an impurity diffusion region of the semiconductor substrate.

7. The sequence in the manufacture of a semiconductor device of claim 6, wherein the impurity diffusion region is a source/drain region.

8. The sequence in the manufacture of a semiconductor device of claim 4, wherein said step of forming the exposed pad comprises forming a polysilicon layer over the semiconductor substrate, and doping the polysilicon layer.

9. The sequence in the manufacture of a semiconductor device of claim 4, wherein said step of determining comprises forming an image of the exposed pad, during in-line manufacture of the semiconductor substrate, whose brightness is indicative of the amount of secondary electrons accumulated on the pad.

10. The sequence in the manufacture of a semiconductor device of claim 5, wherein said step of determining comprises forming an image of the exposed pad, during in-line manufacture of the semiconductor substrate, whose brightness is indicative of the amount of secondary electrons accumulated on the pad.

11. The sequence in the manufacture of a semiconductor device of claim 6, wherein said step of determining comprises forming an image of the exposed pad, during in-line manufacture of the semiconductor substrate, whose brightness is indicative of the amount of secondary electrons accumulated on the pad.

12. The sequence in the manufacture of a semiconductor device of claim 8, wherein said step of determining comprises forming an image of the exposed pad, during in-line manufacture of the semiconductor substrate, whose brightness is indicative of the amount of secondary electrons accumulated on the pad.

13. The sequence in the manufacture of a semiconductor device of claim 4, wherein said step of forming comprises forming a plurality of exposed pads over the semiconductor substrate, said step of directing comprises scanning the semiconductor substrate with the electrons to direct the electrons onto the plurality of exposed pads and thereby produce the secondary electrons on surfaces of the exposed pads, and said step of determining comprises comparing the amount of detected secondary electrons on the respective surfaces of adjacent ones of the plurality of exposed pads.

14. The sequence in the manufacture of a semiconductor device of claim 5, wherein said step of forming comprises forming a plurality of exposed pads over the semiconductor substrate, said step of directing comprises scanning the semiconductor substrate with the electrons to direct the electrons onto the plurality of exposed pads and thereby produce the secondary electrons on surfaces of the exposed pads, and said step of determining comprises comparing the amount of detected secondary electrons on the respective surfaces of adjacent ones of the plurality of exposed pads.

15. The sequence in the manufacture of a semiconductor device of claim 6, wherein said step of forming comprises forming a plurality of exposed pads over the semiconductor substrate, said step of directing comprises scanning the semiconductor substrate with the electrons to direct the electrons onto the plurality of exposed pads and thereby produce the secondary electrons on surfaces of the exposed pads, and said step of determining comprises comparing the amount of detected secondary electrons on the respective surfaces of adjacent ones of the plurality of exposed pads.

16. The sequence in the manufacture of a semiconductor device of claim 8, wherein said step of forming comprises forming a plurality of exposed pads over the semiconductor substrate, said step of directing comprises scanning the semiconductor substrate with the electrons to direct the electrons onto the plurality of exposed pads and thereby produce the secondary electrons on surfaces of the exposed pads, and said step of determining comprises comparing the amount of detected secondary electrons on the respective surfaces of adjacent ones of the plurality of exposed pads.

* * * * *